United States Patent
Timmers et al.

(10) Patent No.: US 9,541,240 B2
(45) Date of Patent: Jan. 10, 2017

(54) LED LIGHT SOURCE

(75) Inventors: Wilhelmus Adrianus Gerardus Timmers, Veldhoven (NL); Wouter Oepts, Eindhoven (NL)

(73) Assignee: PHILIPS LIGHTING HOLDING B.V., Eindhoven (NL)

( * ) Notice: Subject to any disclaimer, the term of this patent is extended or adjusted under 35 U.S.C. 154(b) by 409 days.

(21) Appl. No.: 14/126,097

(22) PCT Filed: Jun. 15, 2012

(86) PCT No.: PCT/IB2012/053020
§ 371 (c)(1),
(2), (4) Date: Feb. 12, 2014

(87) PCT Pub. No.: WO2012/172510
PCT Pub. Date: Dec. 20, 2012

(65) Prior Publication Data
US 2014/0226337 A1    Aug. 14, 2014

(30) Foreign Application Priority Data

Jun. 17, 2011   (EP) .................................... 11170276

(51) Int. Cl.
*F21V 5/04*   (2006.01)
*F21K 99/00*   (2016.01)
(Continued)

(52) U.S. Cl.
CPC . *F21K 9/50* (2013.01); *F21K 9/60* (2016.08); *F21V 5/04* (2013.01); *H01L 25/0753* (2013.01);
(Continued)

(58) Field of Classification Search
CPC ........ H01L 25/0753; H01L 33/58; F21K 9/50; F21V 13/04; F21V 5/04; F21Y 2101/02; F21Y 2105/001
See application file for complete search history.

(56) References Cited

U.S. PATENT DOCUMENTS 6,502,956 B1   1/2003   Wu
7,009,213 B2 *  3/2006   Camras .................. H01L 33/58
                                                            257/98
(Continued)

FOREIGN PATENT DOCUMENTS

CN     101230968 A    7/2008
EP     1648037 A1    4/2006
(Continued)

*Primary Examiner* — Peggy Neils

(57) ABSTRACT

Proposed is a lighting module 100 and an illumination device 200 comprising such a module. The lighting module comprises an array of LEDs 120 mounted on a substrate 110 and an optical structure 130 encompassing the LED array for approximating in operation the LED array as a single homogeneous light source. The optical structure comprises an optical element 140 arranged to provide a luminous intensity profile as a function of a deviation angle a which is substantially constant between $-\alpha_{max}$ and $\alpha_{max}$, wherein $\alpha_{max}$ is a maximum deviation angle provided by the optical element and substantially zero at angles outside that range. This is especially advantageous for optimizing the trade off between creating a single homogenous light source and maintaining the entendue of the light source. An additional advantage of the optical element 140 is that, except for fresnel reflections on both surfaces, it has no backscattering like a diffuser has, which results in a very low optical loss.

18 Claims, 5 Drawing Sheets

(51) Int. Cl.
  *H01L 25/075* (2006.01)
  *H01L 33/58* (2010.01)
  *F21V 13/04* (2006.01)
  *F21Y 101/00* (2016.01)

(52) U.S. Cl.
  CPC ............ *F21V 13/04* (2013.01); *F21Y 2101/00* (2013.01); *F21Y 2105/10* (2016.08); *F21Y 2115/10* (2016.08); *H01L 33/58* (2013.01); *H01L 2924/0002* (2013.01)

(56) References Cited

U.S. PATENT DOCUMENTS

| | | | |
|---|---|---|---|
| 7,506,998 B2 | 3/2009 | Ansems et al. | |
| 2003/0202241 A1 | 10/2003 | Blumel | |
| 2005/0018432 A1* | 1/2005 | Buschmann | H01J 61/34 362/328 |
| 2007/0013057 A1 | 1/2007 | Mazzochette | |
| 2007/0268694 A1 | 11/2007 | Bailey et al. | |
| 2008/0266893 A1 | 10/2008 | Speier | |
| 2009/0168414 A1* | 7/2009 | Bailey | F21V 5/002 362/231 |
| 2009/0219716 A1 | 9/2009 | Weaver et al. | |
| 2009/0302344 A1 | 12/2009 | Inoguchi | |
| 2010/0080012 A1 | 4/2010 | Bernard | |
| 2010/0103678 A1 | 4/2010 | Van De Ven et al. | |
| 2011/0286200 A1* | 11/2011 | Iimura | F21K 9/135 362/84 |
| 2012/0224363 A1* | 9/2012 | Van De Ven | F21K 9/56 362/231 |

FOREIGN PATENT DOCUMENTS

| | | |
|---|---|---|
| EP | 1764841 A1 | 3/2007 |
| EP | 2172696 A1 | 4/2010 |
| EP | 2180232 A1 | 4/2010 |
| JP | 2008066750 A | 3/2008 |
| JP | 2011108584 A | 6/2011 |
| JP | 2012222304 A | 11/2012 |
| WO | WO2005103562 A3 | 11/2005 |
| WO | WO2009148483 A1 | 10/2009 |

\* cited by examiner

LED LIGHT SOURCE

CROSS-REFERENCE TO RELATED APPLICATIONS

This application is the U.S. National Phase application under 35 U.S.C. §371 of International Application No. PCT/IB2012/053020 filed on Jun. 15, 2012, which claims the benefit of and priority to European Patent Application EP11170276.7, filed on Jun. 17, 2011. These applications are hereby incorporated by reference herein.

FIELD OF THE INVENTION

The invention relates to lighting modules and lighting devices. More particularly it relates to modules and devices comprising a substrate and an array of individual LEDs mounted on the substrate. Such modules and devices are used in particular in illumination applications, such as in down-lighters, up-lighters, wall-washers, spot lights, etc.

BACKGROUND OF THE INVENTION

An embodiment of a lighting device of the kind set forth is known from U.S.2010/0103678. That document discloses an LED component comprising a submount for holding an array of LED chips, with the submount having die pads and conductive traces on its top surface. The LED chips forming the array are mounted to a respective one of the die pads. The conductive traces are arranged to provide electrical power to the LED chips, such that in operation they emit light useable to provide an application specific illumination distribution. The LED component further comprises a solid lens covering the array of LED chips and a diffuser for mixing the light emission of the LEDs in the near field. In other words, the diffuser mixes the emission of the LED chips in an attempt to make, when the LED component is observed, the light originating from the discrete LED chips not as clearly individually identifiable as without diffuser. Instead, when the LED component is viewed directly, it approximates a single light source under the lens. The diffuser could be provided as a dome over the lens, wherein the dome may comprise diffusing microstructures such as scattering centers or micro-lenses.

The advantage of this approach lies in the fact that optical inhomogeneities in the far field are prevented. Such inhomogeneities originate from the discrete geometrical locations on the submount of the LED chips in combination with secondary optics usually employed in luminaires, as for instance a reflector in the case of a spot-light illumination application. As a consequence, shadow lines in the far field illumination pattern would occur in the centre of the illumination distribution and especially in its periphery, if not counter acted. Many lighting designers and users consider such effects annoying. Especially when the LED chips emit light of different colors, these shadow lines are colored. The coloration makes them even more observable and thus more annoying than the lighter/darker modulations in the illumination distribution in case all LED chips emit the same color light.

A drawback of the solution described in U.S.2010/0103678, however, is that it enlarges the size of the light source, both mechanically and optically. The mechanical enlargement is due to the physical size of the dome encompassing the LED chip array. The optical enlargement is due to the spreading of the light emitted by the individual LED chips. While this results in a virtual size of the LED chips in the middle of the array that fills the 'dark gaps' between the discrete LED chips, the virtual size of the LED chips near the outer edge of the array extend the size of the light source beyond the physical size of the array. As is well known, a larger light source size complicates the use and design of secondary optics for obtaining an application specific illumination distribution. Especially for narrow-beam spot-light applications, a small light source is desired to maintain a practical and usable size of the secondary optics.

SUMMARY OF THE INVENTION

The invention has as an objective providing a lighting module of the kind set forth which alleviates at least part of the above mentioned drawbacks. This object is achieved according to a first aspect by an lighting module comprising an optical structure which comprises an optical element arranged to provide when observing a light emitting diode through the optical structure with the lighting module in operation, a luminous intensity profile I as a function of a deviation angle $\alpha$ which is substantially constant between $-\alpha_{max}$ and $+\alpha_{max}$, wherein $\alpha_{max}$ is a maximum deviation angle provided by the optical element, and substantially zero (i.e. ≤10%, preferably ≤5%, more preferably ≤1% of the luminous intensity at x=0), above $+\alpha_{max}$ and below $-\alpha_{max}$. The invention provides a device that homogenizes the light source while at the same time minimizes the extension of its size. The optical element allows creating a virtual LED source that provides an illumination E' in the plane of the LEDs substantially constant over a predetermined distance. Preferably, the predetermined distance corresponds to the pitch P of the array of LEDs. An additional advantage of the optical element is that, except for Fresnel reflections on inner and outer surfaces of the optical structure, it does not exhibit backscattering as a diffuser does. Therefore it results in a very low optical loss.

In an embodiment the optical structure comprises a plurality of optical elements wherein each optical element provides a maximum deviation angle $\alpha_{max}$ in dependence on its position on the optical structure. Advantageously, this allows adjusting for the geometrical angles and corresponding distances with which the optical element views the LEDs in the array.

In an embodiment, controlling the maximum deviation angle $\alpha_{max}$ of an optical element through its size $r_{max}$ beneficially allows easy tooling of a pre-form part for creating an injection moulded optical structure.

Advantageously, optical element forms an aspherical lenslet. In an embodiment, the maximum deviation angle $\alpha_{max}$ provided by the aspherical lenslet increases linearly with its size $r_{max}$. This allows creating a constant luminous intensity profile between $-\alpha_{max}$ and $+\alpha_{max}$. Beneficially, the lenslet has at least one cross-section with a parabolic shape.

In an embodiment, the optical elements are positioned on a first side of the optical structure facing the array of light emitting diodes.

The optical elements may have a convex shape or a concave shape. Beneficially this protects the optical elements from detrimental environmental effects, such a grease or dust that may diminish their optical function.

In an embodiment, the optical elements have a polygonal contour. Beneficially this allows the plurality of optical elements form a geodesic dome.

In an embodiment, the optical structure further comprises an optical component for providing a secondary optical function. As an example, the secondary optical function may allow beam shaping the light emitted near the optical axis of the lighting module, for instance by concentrating the centre part of the light emitted from the module. Alternatively, the second optical function may be provided by arranging the thickness t of the optical structure to be dependent on the height above the substrate. Such a configuration creates a locally varying optical wedge, allowing controlling the light beams emitted by the LEDs and their interaction with a secondary optics cooperatively arranged with respect to the lighting module, such as a reflector.

In an embodiment, the optical structure further comprises means for adjusting the optical performance of the light module. For instance, the optical structure may comprise a dye for adjusting the spectral transmission characteristics of the structure. Beneficially this allows adjusting the optical efficiency of the lighting module and/or adjusting the spectrum of the light emitted for controlling f.i. the color rendering characteristics.

According to a second aspect, the invention provides an illumination device comprising a lighting module according to any of the preceding claims, and secondary optics cooperatively arranged with respect to the lighting module in order to provide an application specific illumination distribution. Beneficially such an illumination device allows creating an illumination distribution freed form annoying lighter/darker modulations or even colored modulations when applying LEDs emitting multiple primary colors.

These and other aspects of the invention will be apparent from and elucidated with reference to the embodiments described hereinafter. Appreciate, however, that these embodiments may not be construed as limiting the scope of protection for the invention. They may be applied individually, as well as in combination.

BRIEF DESCRIPTION OF THE DRAWINGS

Further details, features and advantages of the invention are disclosed in the following description of exemplary and preferred embodiments in connection with the drawings.

DETAILED DESCRIPTION OF THE EMBODIMENTS

Figure 1:
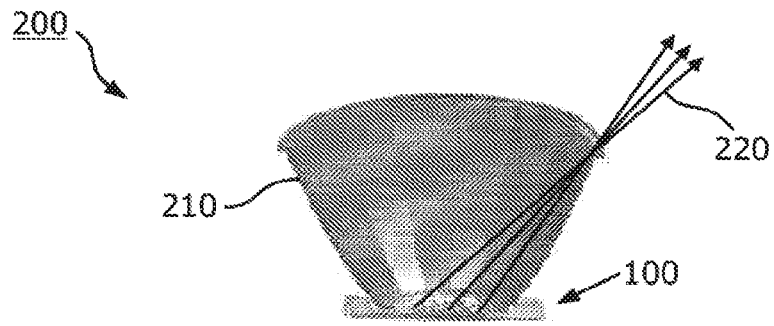
FIG. 1 schematically shows a cross section of an illumination device according to the prior art.
Figure 2:
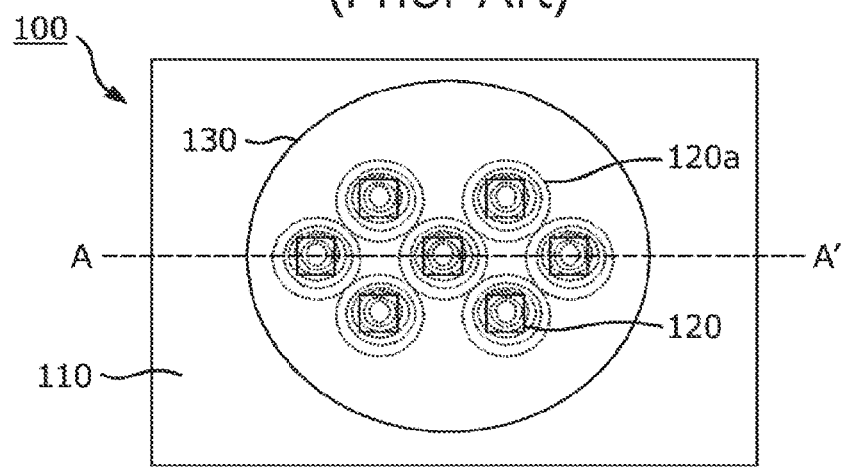
FIG. 2 shows diagrammatically a top view of a lighting module according to the prior art.

FIG. 1 schematically shows a cross-section of an illumination device 200, such as a down-lighter, an up-lighter, a wall-washer, a spot-light, etc. The illumination device comprises a lighting module 100 and secondary optics 210 cooperatively arranged with respect to the lighting module for providing an application specific illumination distribution. As FIG. 2 shows, lighting module 100 may comprise, in dependence on the illumination application requirements and the lumen output per light emitting diode (LED), an array of individual LEDs 120. These LEDs may be mounted on a substrate 110 of the module in such a way that the LEDs can be either individually or collectively controlled to emit light. Furthermore, the LEDs 120 may be mounted in such a way that the substrate forms part of a thermal pathway to a heat sink (not shown) for maintaining a junction temperature of the LEDs during operation in line with their specifications. The LEDs 120 may be LED chips, so that they form a chip-on-board system. Alternatively, the LEDs may be packages comprising a LED chip, such as for instance the Philips Lumileds Lighting LUXEON Rebel. The LEDs may be arranged to all emit the same spectrum, being it a small bandwidth spectrum directly created in the pn-junction of the LEDs or a large bandwidth spectrum, such as white light, created f.i. through the use of a wavelength converter—i.e. so called phosphor coated or pc-LEDs. Alternatively, the LEDs may be arranged to emit different primary colors (such as f.i. red, green, blue, and amber) that may be mixed to provide an application specific illumination distribution (specified by a flux distribution as well as a spectral distribution).

It is advantageous to position the LEDs 120 in a dense array, for instance a closed packed array, since this reduces the size of the overall light source formed by the array. Smaller light sources beneficially influence the formation of a predefined illumination distribution by the secondary optics 210 of an illumination device 200. The secondary optics may be formed by an appropriately shaped reflector, such as a parabolic, segmented, or free-form shaped metal or metalized reflector. Alternatively, it may be formed by a massive transparent optical component exhibiting TIR, such as a compound concentrator. Even with such a densely packed array, however, it consists of a plurality of individual LEDs emitting, in operation, a corresponding number of light beams 220. The collection of light beams forms the illumination distribution provided by the illumination device 200. Due to the physical distance between the LEDs 120 in the array, the light beams 220 create visible brighter and darker lines in the far field illumination pattern. These lines can be especially annoying in the periphery of the illumination distribution where they are visible as rings. Moreover, the illumination distribution may also exhibit non-uniformities in parts generated via the secondary optics 210.

To counter act the formation of such optical artefacts in the illumination distribution, a dome 130 usually is positioned over the LED array 120 arranged to diffuse the light emitted by the LEDs. Such a diffusing dome results in the light beams 220 seemingly originating from extended virtual LED sources 120a (FIG. 2).

Figure 3:
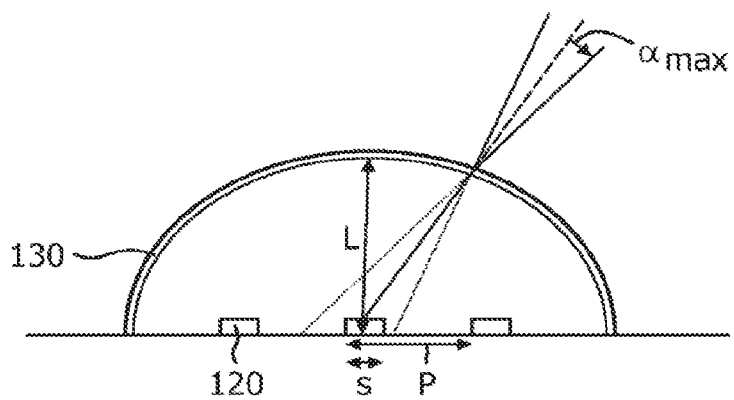
FIG. 3 shows the cross section along the line AA' of the lighting module of FIG. 2.
Figure 4A:
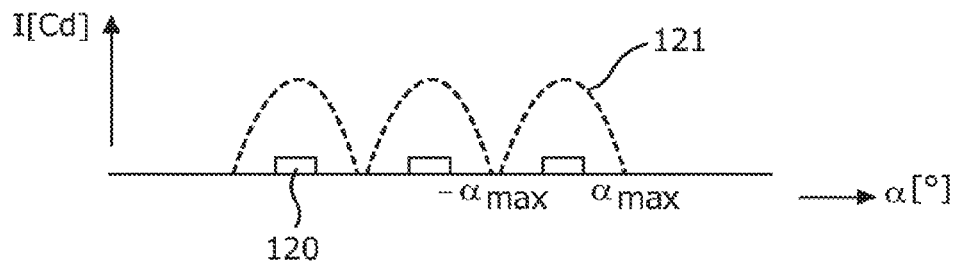
FIGS. 4A, B, C & D show diagrammatically luminous intensity profiles according to the prior art.
Figure 4B:
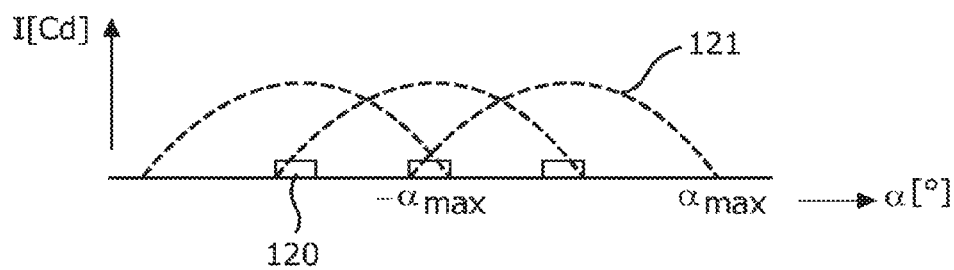
Figure 4C:
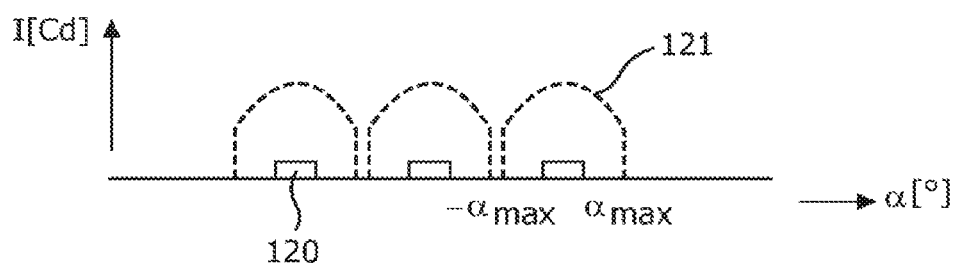
Figure 4D:
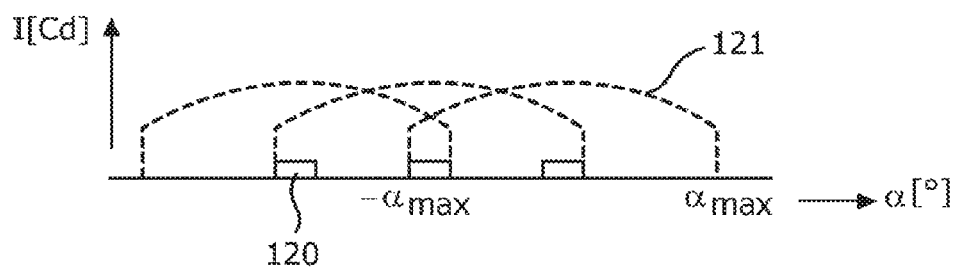

As FIG. 3 schematically depicts, positioning a diffusing hemisphere 130 with a radius L over an array of LEDs 120 with individual size s and positioned on a pitch P results in the scattering (through microstructures in the dome) or refraction (through micro-lenses on the dome) of the light emitted over a deviation angle α. Typically, s is in the range of 1×1-2×2 mm² and P in the range of 2-6 mm. The deviation angle is limited to a maximum deviation angle $\alpha_{max}$, which value is dependent on the microstructure applied in the diffusing dome. As a result, the luminous intensity profile 121 as a function of the deviation angle α typically has the form depicted in FIGS. 4A and C, for scattering microstructures and micro-lenses, respectively. Thus while such microstructures and micro-lenses applied in or on the diffusing dome virtually enlarge the size of the light emitting surface of the LED into the 'dark' area between the LEDs 120 in the array thereby contributing to creating a homogenous light source, clearly such a typical contribution is suboptimal. The fall-off of the luminous intensity profile 121 as a function of the deviation angle may be compensated by adjusting the microstructures and micro-lenses to exhibit a larger maximum deviation angle $\alpha_{max}$. For instance, the size and index of refraction of the scattering centre may be adjusted. Alternatively, the radius of curvature and/or the size of the micro-lens may be adjusted. Indeed this improves the homogeneity of the light source at the expense, however, of the virtual light source size (FIGS. 4B&D). Moreover, to accommodate microstructures on the dome providing such larger maximum deviation angle $\alpha_{max}$ the dome size L generally has to increase.

Figure 5A:
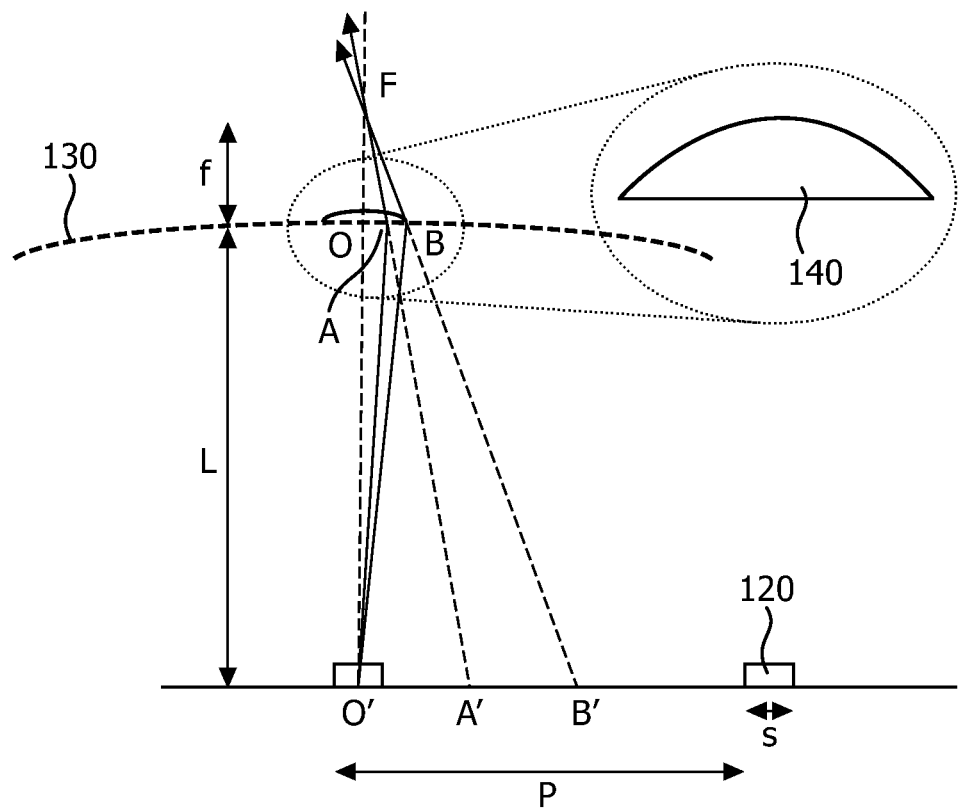
FIG. 5A shows diagrammatically an optical element according to the invention.

FIG. 5A schematically depicts an optical element 140 according to the invention. For the discussion to follow, the deviation angle $\alpha$ for a light ray originating from an LED 120 positioned in O' and intersecting optical element 140 in A and refracted to focal point F is defined as the angle OFA=angle O'FA'. Analogously, the maximum deviation angle $\alpha_{max}$ is defined as the angle OFB=angle O'FB' corresponding to the marginal light ray just intersecting optical element 140. Thus, with f the focal length of optical element 140 and $r_{max}$ its size (=OB), the following relation holds:

$$f = r_{max}/\tan \alpha_{max}$$

Figure 5B:
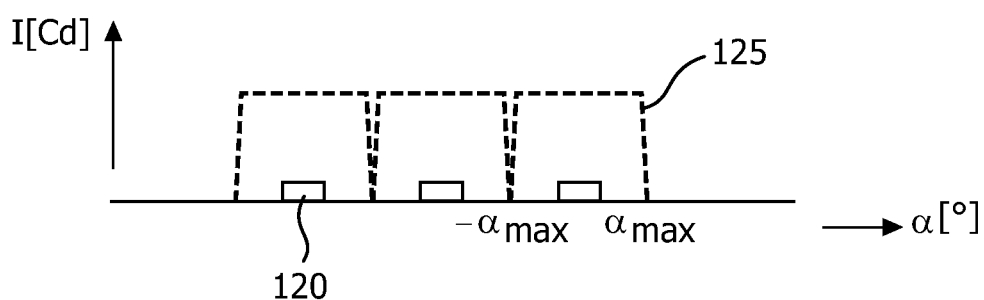
FIG. 5B shows diagrammatically a luminous intensity profile according to the invention.

The invention is based on the insight that arranging the optical structure 130 to comprise an optical element 140 providing, when observing a LED 120 through the optical structure with the lighting module 100 in operation, a luminous intensity profile I 125 as a function of a deviation angle $\alpha$ which is substantially constant between $-\alpha_{max}$ and $+\alpha_{max}$ optimizes the trade-off between an homogenous light source on the one hand and a small (or limited) light source on the other hand. As FIG. 5B schematically depicts, applying such optical elements 140 essentially homogeneously fills the 'dark space' between the LEDs 120 of the array, while advantageously minimizes the extension of the overall size of the virtual light source compared to the overall size of the physical light source (i.e. the diameter of the circumcircle). As a consequence, the etendue of the light source is hardly enlarged. Moreover, limiting the maximum deviation angle simultaneously limits the necessary size L of the optical structure 130.

In a preferred embodiment, $\alpha_{max}$ is chosen such that the following relationship holds:

$$\tan\alpha_{max} = \frac{\frac{P-s}{2} - r_{max}}{L}$$

Advantageously, this allows creating two virtual light sources, corresponding to adjacent LEDs 120, that have an extended size equal to the pitch P of the array such that a single homogeneous light source is formed with a size 2 P. As a consequence, the overall size of the virtual light source is minimally extended compared to the overall size of the physical light source by the value of pitch P. Typically, the size L of the optical structure 130 can be limited to about 1.1 times the circumradius of the LED array. In a configuration of the LED array 120, such as schematically depicted in FIG. 2, L may typically be in the range of 10-13 mm, and $\alpha_{max}$ in the range 10°-20°. These dimensions, however, are strongly dependent on the circumradius of the LED array.

Describing the optical element 140 to provide, when observing a LED 120 through the optical structure with the lighting module 100 in operation, a luminous intensity profile I 125 as a function of a deviation angle $\alpha$ which is substantially constant is equivalent to describing the illumination E' in the plane of the LEDs 120 provided by the virtual LED source to be constant between $-(L+f)/\tan \alpha_{max}$ and $+(L+f)/\tan \alpha_{max}$. In other words, optical structure 130 comprises an optical element 140 arranged to create, with the lighting module in operation, a virtual light source corresponding to an LED 120, the virtual light source providing an illumination E' in the plane of the LEDs 120 which is substantially constant between $-(L+f)/\tan \alpha_{max}$ and $+(L+f)/\tan \alpha_{max}$, wherein $\alpha_{max}$ is a maximum deviation angle provided by the optical element, f a focal length of the optical element, and L the distance between LED 120 and optical element 140.

In the context of the invention, substantially constant is to be understood to mean that difference between the maximum luminous intensity $I_{max}$ and the minimum luminous intensity $I_{min}$ of luminous intensity profile I 125 between $-\alpha_{max}$ and $+\alpha_{max}$ is smaller than 20%, i.e. $(I_{max}-I_{min})/I_{max}<20\%$. Preferably, this ratio is smaller than 15%, even more preferably smaller than 10%, or even smaller than 5%. Equivalently, it can be understood to mean that the difference between the maximum illumination $E'_{max}$ and the minimum illumination $E'_{min}$ provided by the virtual light source in the plane of the LEDs is smaller than 20%, i.e. $(E'_{max}-E'_{min})/E'_{max}<20\%$. Preferably, this latter ratio is smaller than 15%, even more preferably smaller than 10%, or even smaller than 5%.

In an embodiment, optical element 140 is an aspheric lenslet. In an embodiment, at least one cross section of such an aspheric lenslet has a parabolic shape. Optical element 140 according to the invention hence may have several types of contours. For instance, the contour may be circular and optical element 140 may be formed by rotating a parabola around the optical axis of the lenslet. Alternatively, the contour may be elliptical such that a radius of curvature of a first parabola along the long axis of the ellipse may be smaller than a radius of curvature of a second parabola along the short axis of the ellipse. Alternatively still, the contour of such circular or elliptical optical elements may be truncated in the form of a polygon, such as a triangle, a square, a rectangle, a rhombus, a rhomboid, a pentagon, a hexagon, etc. Preferably, such polygonal contours are constructed such that they allow tessellations and/or the formation of (regular) convex polyhedra. Also, optical element 140 may only have a single cross section forming a parabola, such as an optical element having a square of rectangular contour and refracting light in one direction only. Alternatively still, the optical element 140 may be asymmetrical, i.e. the optical axis of optical element may not coincide with the centre of the contour or optical element may exhibit two or more radii of curvature.

Except for the case of a circular symmetrical optical element 140, the example lenslets described above will exhibit two or more maximum radii (equivalent with OB in FIG. 5A), dependent on the direction in which the radius is measured. For instance, a circular symmetrical optical element 140 truncated as a regular polygon will exhibit a smallest $r_{max}$ and a largest $r_{max}$, respectively associated with the apothem (i.e. the length of the line segment from the centre to the midpoint of one of its sides) and with the circumradius (i.e. the length of the line segment from the centre to one of its corners). The maximum deviation angle $\alpha_{max}$ is determined by the maximum radius $r_{max}$, the radius of curvature R of the lenslet, and the index of refraction n of the lenslet material, and in case of a parabolic lenslet is given by:

$$\alpha_{max} = (n-1)\frac{r_{max}}{R}$$

Consequently, such circular symmetric optical element 140 truncated as a regular polygon will not exhibit a luminous intensity profile I 125 as a function of a deviation angle $\alpha$ which is completely constant between $-\alpha_{max}$ and $\alpha_{max}$, as a circular symmetric optical element would do. Instead, the luminous intensity profile of a truncated optical element can be considered as the average intensity profile of a number of lenslets i having corresponding maximum deviation angles $\alpha_{max,i}$.

Figure 6:
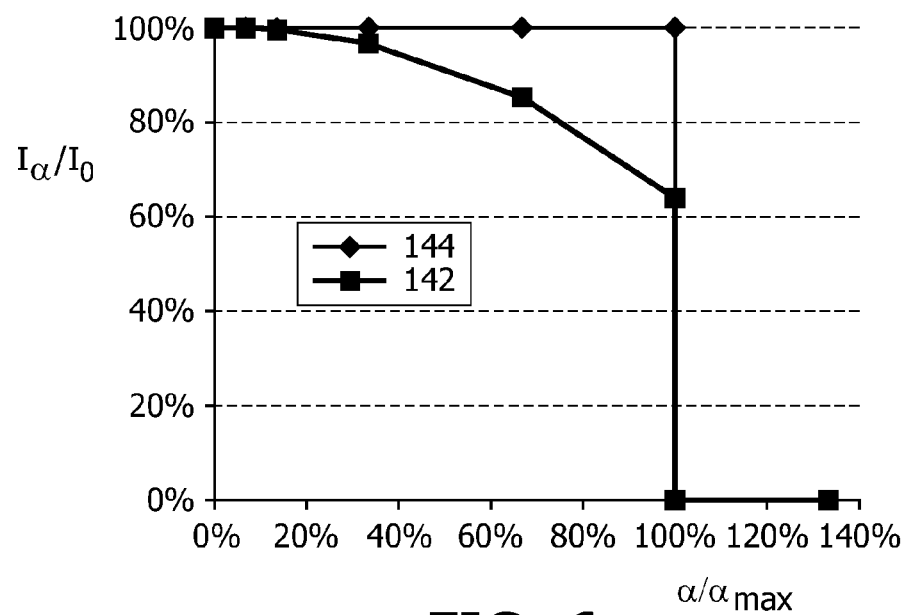
FIG. 6 shows a comparison of the relative luminous intensity profile between a parabolic and a spherical optical element.

FIG. 6 shows the dramatic difference between a luminous intensity profile of a parabolic lenslet 144 and a spherical lenslet 142. As can be discerned the circular symmetric parabolic optical element 140 having a parabolic cross section creates a luminous intensity profile 144 that is constant for all deviation angles $\alpha$ up to $\alpha_{max}$. In contrast, a circular symmetric spherical lenslet with the same radius of curvature creates a luminous intensity profile 142 that falls off steeply as a function of the deviation angle. The difference results from the fact that the maximum deviation angle $\alpha_{max}$ provided by a parabolic optical element 140 is a linear function of the size $r_{max}$ of the element, while it is at least a third order polynomial in case of a spherical lenslet. Extending the size of a lenslet (having a predetermined radius of curvature) increases the light flux emitted by the LEDs captured by the lenslet, while at the same time the solid angle into which the light is refracted increases. In case of a parabolic lenslet, these two effects cancel each other, thus maintain a constant luminous intensity. In contrast, in case of a spherical lenslet the solid angle increases much faster than the increase in the flux captured, resulting in the sharp fall-off of the luminous intensity profile depicted in FIG. 6.

In an embodiment, optical structure 130 comprises a plurality of optical elements 140. The maximum deviation angle $\alpha_{max}$ provided by an optical element may be arranged to depend on its position on the optical structure. As an example, optical elements 140 positioned near the rim of the optical structure 130 (i.e. closer to the substrate 110) may be arranged to provide a smaller or larger $\alpha_{max}$ than optical elements positioned closer to the optical axis of the light module. Alternatively, the elements near the rim may be made asymmetrical, for instance by constructing them to have a radius of curvature R1 in a first direction and a radius of curvature R2 (different from R1) in a second direction. Advantageously, this allows correcting for the goniometrical angles under which these elements 'view' the LED array 120. This is especially interesting when the viewed inter-LED distances in radial- and tangential direction are different, as for example depicted in FIG. 7. When, in addition, the centre of the lenslets is de-centered with respect to its contour it allows for diffusing the light as if emitted more from the centre of the array resulting in a more confined light source and a better maintained etendue. The maximum deviation angle $\alpha_{max}$ may be controlled by both the size $r_{max}$ of the optical element 140 and its radius of curvature R. In practice, control through $r_{max}$ provides the benefit that the tooling becomes more straightforward as all elements than have the same curvature R (or the same parabolic shape).

In an embodiment, optical structure 130 comprises a plurality of optical elements 140 having a polygonal contour wherein the side where two adjacent optical elements touch each other is shaped as a lens, preferably as a lens having a parabolic cross section. Advantageously, this avoids the two adjacent optical elements to form a ridge at the side where they touch. Such a ridge would have a top angle ($\alpha_{max1}$+ $\alpha_{max2}$), with $\alpha_{max\ 1,2}$ the maximum deviation angle of the two optical elements. Avoiding such a ridge beneficially smoothen the illumination distribution created by the illumination device.

Figure 7:
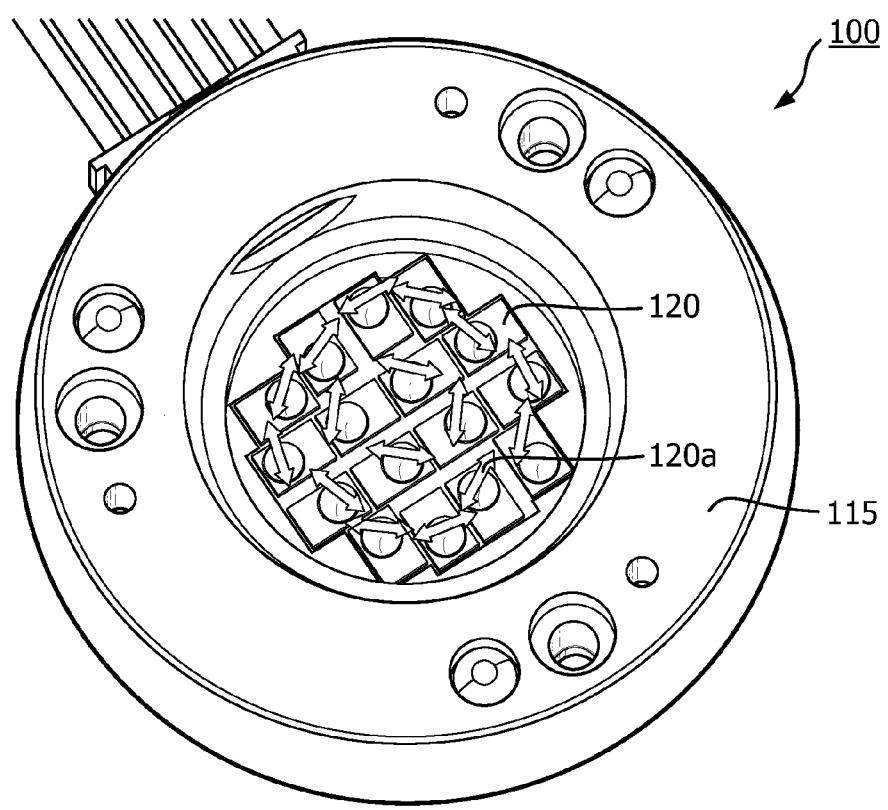
FIG. 7 shows a tangential light spread according to an embodiment of the invention.

As an example, the optical structure 130 may comprise grooves or a ridge having a parabolic cross sectional shape. The grooves and ridges may be manufactured such that they are oriented parallel to the substrate of the lighting module 100—i.e. parallel to the plane of the LED array 120. Alternatively, the grooves or ridges may be manufactured such that the oriented at right angles to the first case—i.e. perpendicular to the plane of the LED array 120 at least near the rim of the optical structure 130. Such grooves and ridges result in refraction of the light emitted in one direction only. In this former case, the light emitted seems to originate from virtual LED sources elongated in a radial direction relative to the optical axis of the module. In the later case, the light emitted seems to originate from virtual LED sources 120a elongated in a tangential direction relative to the optical axis of the module, as schematically depicted in FIG. 7. Especially in the later case, the entendue of the light source as a whole is well maintained while simultaneously providing for a single homogenous light source. In embodiments, such as the ones described here it may be beneficial to design the optical structure 130 not as a hemisphere or geodesic. Instead, it may be beneficial to design it as a flat-topped or round-topped cylinder, or in general as a convex polyhedron.

Figure 8:
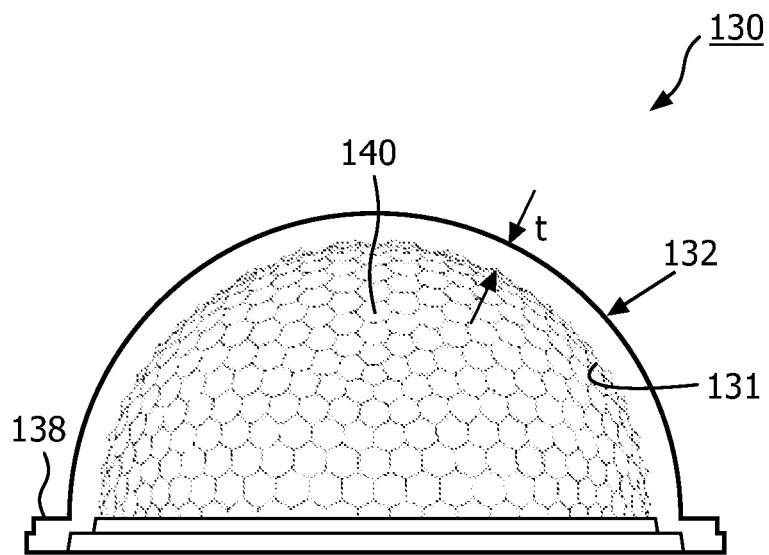
FIG. 8 shows a cross section of an optical structure in accordance with the invention.

Optical structure 130 has a first or inner surface 131, as shown in FIG. 8, oriented towards the LED array 120 and a second or outer surface 132 facing away from the array. While the optical elements 140 may be positioned on both the inner and/or the outer surface, positioning them on the inner surface provides benefits. In particular, positioned on the inside of the structure the optical elements 140 are protected from detrimental environmental effects, such a grease or dust that may diminish their optical function. Moreover, in case the optical structure 130 is arranged as an injection moulded device, the optical elements can be prepared on the convex pre-form part as this part provides better tooling access than its concave counterpart. An example of such a configuration is depicted in FIG. 8, showing a cross sectional view of an optical structure 130 comprising a plurality of optical elements 140 on the inside surface 131 forming a geodesic dome. Especially suitable materials for creating such an injection moulded device are plastics, such as polycarbonate, and silicones. As the optical structure 130 is positioned closely to the LEDs—which in operation usually are at elevated temperatures, such as 80° C. or higher, and emit high light fluxes, such as 100 lm per LED or more—silicone is a preferred material due to its durability over life under such loads.

In embodiments, the optical elements 140 may be provided as concave elements in or convex elements on the optical structure 130. Convex elements provide benefits for tooling of these structures in the convex pre-form part for an injection moulded device. In another embodiment, the optical elements 140 may be provided as holographic elements. Holographic in this sense means that an optical element 140 is not applied as discrete elements as in FIG. 8. Instead, the inner and/or outer surfaces 131,132 exhibit a random distribution of local surface elements having angles α between $-\alpha_{max}$ and $+\alpha_{max}$ and the statistical distribution of all angles α is the same as the corresponding discrete lenslets (exhibiting for instance a parabola cross section).

Figure 9:
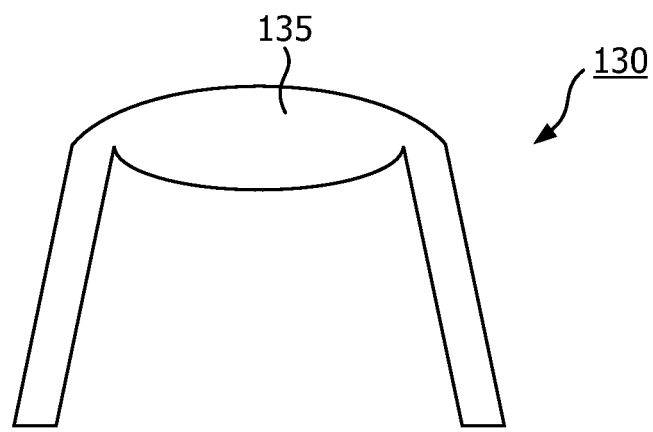
FIG. 9 schematically shows an embodiment of the optical structure comprising an optical component for providing a secondary optical function.

In an embodiment, the optical structure 130 may have a thickness t that is dependent on the height above the substrate. As an example, the thickness t may be smaller at larger heights (i.e. near the optical axis of the lighting module 100) and may be larger at lower heights (i.e. towards the rim of the optical structure 130), or vice versa. Such a configuration creates an optical wedge, allowing controlling the light beams emitted by the LEDs and their interaction with the secondary optics 210. Such control can be beneficially used for the creation of application specific illumination distributions. Alternatively, or in combination, the optical structure 130 may further comprise an optical component 135 arranged to provide a secondary optical function (FIG. 9). For instance, by controlling the thickness t in such a way that the optical component provides a lens function. Such an optical component may be positioned at the apex of the optical structure 130, i.e. near the optical axis of the lighting module 100, for concentrating the centre part of the light emitted from the module. Advantageously, the optical component allows shaping the direct light from the LEDs 120. Direct light, in this sense, is light that exits illumination device 200 without having been reflecting on the secondary optics 210. Alternatively, component 135 can be designed such that most of the light hits the reflector. In this case the illumination distribution can be controlled optimally through appropriately shaping the reflector 210. In the context of the invention, the secondary optical function provided by the optical component 135 controls the combined output of the lighting module 100. In contrast, the primary optical function provided by the optical elements 140 homogenizes the light source while maintaining its entendue.

The optical structure 130 may be assembled onto the substrate 110 using a variety of techniques. For instance, it may be glued to the substrate. Alternatively, it may be fixed through the use of a flange 138. Such a flange may be bolted to the module, or may be clamped between the substrate 110 and the secondary optics 210. Alternatively, flange 138 may be clamped between substrate 110 and a cover 115 (see FIG. 7) overlying the outer part of the substrate.

In an embodiment, the lighting module 100 comprises a second optical structure encompassing the first optical structure. Advantageously, this allows further homogenization of the (virtual) light source and control of the application specific illumination distribution realized. Alternatively, the first optical structure (and/or the second one if present) may be an asymmetrical structure. Advantageously, this allows creating asymmetrical illumination distributions. As an example, the illumination distribution may be square or rectangular, which is beneficial for instance in display lighting applications or street lighting applications, respectively.

In an embodiment, the array of LEDs 120 comprises LEDs emitting different primary colors, such as red, green, blue, and amber. In such embodiments the array of LEDs 120 may be arranged as an array of clusters, in which a cluster comprises all primary colors. A cluster in this sense is defined as a group of LEDs which are positioned at a distance to each other considerably smaller than the pitch P of the array. In other words, a cluster forms a dense group of LEDs. Beneficially the maximum deviation angle $\alpha_{max}$ may be limited while at the same time ensuring good color mixing of the light emitted by the LEDs in a cluster and thus creating a uniform color of the light source as a whole. In such a case $\alpha_{max}$ can be designed using the pitch P' of the clusters instead of the pitch P of the LED array.

In an embodiment, optical structure 130 may comprise means for adjusting the optical performance of the light module 100. For instance, the means may comprise a thin film coating applied to a surface of the optical structure 130. Preferably the surface on which the coating is applied is the opposite surface on which the optical elements 140 are located. Thus, if the optical elements are located on the inner surface 131 of optical structure 130, the coating may beneficially applied on the outer surface 132. In an embodiment, the coating may be an Anti-Reflex coating to improve the optical efficiency of the optical structure 130. In another embodiment, the coating may have a predefined spectral transmission and/or reflection. This allows controlling the overall spectral transmission of the light emitted by the LEDs 120 and thus, allows achieving an improved color rendering or improved color coordinates of the light emitted. Alternatively, the means for adjusting the optical performance may comprise adding a spectrally effective component to the optical structure 130. As an example, a silicone dome may comprise a dye to adjust the spectral transmission and/or reflection properties and thus control the optical performance of the lighting module.

Although the invention has been elucidated with reference to the embodiments described above, it will be evident that alternative embodiments may be used to achieve the same objective. For instance, it is not necessary that the array of LEDs 120 has a fixed pitch P or that the LEDs all have the same size s. The LEDs may be mounted on substrate 110 with a varying distance between them. Different LEDs may have different sizes. The varying distances and sizes may be compensated by varying the characteristics (radius of curvature, size, contour, and asymmetry) of the optical elements 140 as a function of their position on the optical structure 130. Moreover, different embodiments may be combined to provide synergetic optical effects. The scope of the invention is therefore not limited to the embodiments described above. Accordingly, the spirit and scope of the invention is to be limited only by the claims and their equivalents. The invention allows homogenizing the light source while minimally extending it by applying an optical element designed to create a virtual LED source just large enough so that two adjacent virtual LED sources touch each other and have substantially the same luminance. This is achieved with an optical element exhibiting a substantially constant luminous intensity profile between $-\alpha_{max}$ and $\alpha_{max}$, wherein $\alpha_{max}$ is a maximum deviation angle provided by the optical element. The minimal extension of LED 120 to virtual LED source need not be rotationally symmetrical.

The invention claimed is:

1. A lighting module comprising:
   a substrate,
   an array of light emitting diodes mounted on the substrate; and
   an optical structure encompassing the array of light emitting diodes for approximating in operation the array of light emitting diodes as a single light source, wherein the optical structure comprises a plurality of optical elements,
   wherein each optical element of the plurality of optical elements is arranged to provide, when observing a given light emitting diode of the array through the optical element with the lighting module in operation, a luminous intensity profile I as a function of a deviation angle $\alpha$ which is substantially constant between $-\alpha_{max}$ and $\alpha_{max}$, wherein the deviation angle is an angle between a central line and light rays forming an image of the given LED appearing from the optical element, wherein the central line is formed between the center of the given LED and the center of the optical element wherein $\alpha_{max}$ is the angle between the central line and a light ray defining an outer edge of the image of the given LED appearing from the optical element, and wherein the magnitude of $\alpha_{max}$ provided by each optical element depends on the position of the optical element on the optical structure.

2. A lighting module according to claim 1, wherein the maximum deviation angle $\alpha_{max}$ of the optical elements is controlled through the sizes of the optical elements.

3. A lighting module according to claim 1, wherein the optical element forms an aspherical lenslet.

4. A light module according to claim 3, wherein the maximum deviation angle $\alpha_{max}$ of the optical element increases linearly with the size of the optical element.

5. A lighting module according to claim 4, wherein each optical element of the plurality of optical elements is a lenslet having at least one cross-section with a parabolic shape.

6. A lighting module according to claim 2, wherein the optical elements are positioned on a first side of the optical structure facing the array of light emitting diodes.

7. A lighting module according to claim 2, wherein the optical elements have a convex shape or a concave shape.

8. A lighting module according to claim 1, wherein the plurality of optical elements form a geodesic dome.

9. A lighting module according to claim 8, wherein the optical elements have a polygonal contour.

10. A lighting module according to claim 1, wherein the optical structure further comprises an optical component for providing a secondary optical function.

11. A lighting module according to claim 1, wherein the optical structure further comprises means for adjusting the optical performance of the light module.

12. A lighting module according to claim 11, wherein optical structure comprises a dye for adjusting the spectral transmission characteristics of the structure.

13. An illumination device comprising a lighting module according to claim 1, and secondary optics cooperatively arranged with respect to the lighting module in order to provide an application specific illumination distribution.

14. A lighting module according to claim 9, wherein the side where two adjacent optical elements touch each other is shaped as a lens.

15. A lighting module according to claim 1, wherein $\alpha_{max}$ is an acute angle.

16. A lighting module comprising:
a substrate;
an array of light emitting diodes mounted on the substrate; and
an optical structure encompassing the array of light emitting diodes for approximating in operation the array of light emitting diodes as a single light source, wherein the optical structure comprises a plurality of lenslets, each lenslet of the plurality of lenslets having at least one cross-section with a parabolic shape,
wherein each lenslet of the plurality of lenslets is arranged to provide, when observing a given light emitting diode of the array through the optical element with the lighting module in operation, a luminous intensity profile I as a function of a deviation angle $\alpha$ which is substantially constant between $-\alpha_{max}$ and $\alpha_{max}$, wherein the deviation angle is an angle between a central line and light rays forming an image of the given LED appearing from the optical element, wherein the central line is formed between the center of the given LED and the center of the optical element, and wherein $\alpha_{max}$ is the angle between the central line and a light ray defining an outer edge of the image of the given LED appearing from the optical element.

17. A lighting module according to claim 16, wherein each lenslet of the plurality of lenslets includes a respective parabolic vertex in said at least one cross-section.

18. A lighting module according to claim 16, wherein $\alpha_{max}$ is an acute angle.

* * * * *